(12) United States Patent
Curnalia et al.

(10) Patent No.: US 7,542,302 B1
(45) Date of Patent: Jun. 2, 2009

(54) MINIMIZING THICKNESS OF DEADFRONTED DISPLAY ASSEMBLIES

(75) Inventors: Michael A. Curnalia, Tucson, AZ (US);
Michael L. Harper, Tucson, AZ (US);
Craig A. Klein, Tucson, AZ (US);
Gregg S. Lucas, Tucson, AZ (US);
Mary Anne J. Marquez, Tucson, AZ (US); Robert E. Medlin, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/172,647

(22) Filed: Jul. 14, 2008

(51) Int. Cl.
*H05K 1/18* (2006.01)

(52) U.S. Cl. .................. 361/761; 174/255; 174/260; 174/262; 257/680; 257/682; 257/683; 257/758

(58) Field of Classification Search .......... 361/761; 174/255, 260, 262; 257/680, 682, 683, 758
See application file for complete search history.

(56) References Cited

U.S. PATENT DOCUMENTS

| | | | |
|---|---|---|---|
| 5,798,014 A * | 8/1998 | Weber | 156/263 |
| 6,242,079 B1 * | 6/2001 | Mikado et al. | 428/209 |
| 6,487,083 B1 * | 11/2002 | Kwong | 361/761 |
| 6,573,653 B1 * | 6/2003 | Ishinaga | 313/512 |
| 6,661,084 B1 * | 12/2003 | Peterson et al. | 257/680 |
| 6,674,159 B1 * | 1/2004 | Peterson et al. | 257/680 |
| 7,258,649 B2 * | 8/2007 | Matsunaga et al. | 477/120 |
| 7,339,118 B1 * | 3/2008 | Takada et al. | 174/255 |
| 7,415,761 B2 * | 8/2008 | Hirose et al. | 29/852 |
| 2006/0043382 A1 * | 3/2006 | Matsui et al. | 257/79 |
| 2006/0202344 A1 * | 9/2006 | Takada et al. | 257/758 |
| 2008/0118867 A1 * | 5/2008 | Sato et al. | 430/286.1 |

* cited by examiner

*Primary Examiner*—Xiaoliang Chen
(74) *Attorney, Agent, or Firm*—Cantor Colburn LLP; Randall Bluestone

(57) ABSTRACT

An apparatus is provided and includes a label layer, disposed in a user visible interface of a front bezel, in which an icon is etched, a multi-layer printed circuit board (PCB), abutting a rear surface of the label layer and being configured to form a light source housing that positionally corresponds to that of the icon, a light source assembly, including a substrate, which is fixedly recessed in a rear portion of the light source housing, and a light emitting portion, supported by the substrate, from which light is emitted toward at least the icon, and solder plating to reflect light emitted by the light source away from the preselected icon toward the preselected icon.

1 Claim, 3 Drawing Sheets

MINIMIZING THICKNESS OF DEADFRONTED DISPLAY ASSEMBLIES

BACKGROUND

Aspects of the present invention are directed to deadfronted display assemblies and, more particularly, to deadfronted display assemblies having minimized thicknesses.

In space constrained products, the size of a user display area can be limited by spatial requirements. In particular, while the X and Y display dimensions of the display area are important in the user visible interface but may not be limited in terms of their size, the Z dimension can be critical in the overall manufacture of the display assembly and may have stringent size limitations.

Typically, product displays use light emitting diode (LED) indicators for status information, such as power on/off conditions, fault conditions and miscellaneous status conditions. Some displays, such as front bezel display assemblies employ LEDs that are actually located on a separated mother board along with lightpipes to direct the visual status information to the display bezel. Other displays use a display bezel that itself incorporates the LED indicators but is separate from the motherboard.

Front bezel displays are usually affixed to sheet-metal assemblies and generally use embedded LEDs without lightpipes. Here, the LEDs may be surface mounted on the top of a display card in, e.g., a deadfronted display, in which an illumination source is located behind an etched display panel. When the illumination source is turned off there is no visual indication of the message, nor can the characters be readily discerned. However, when the illumination source is turned on, the illumination source backlights the display characters and causes them to be visually noticeable.

In order to provide a properly visible display, both lightpipes and deadfronting display techniques may be required to overdrive the brightness of the illumination source (e.g. an LED). This serves to account for losses in the light path. Overdriving LEDs, however, can reduce their reliability and lifetimes.

In addition, it has been seen that display assemblies may include PCB FR4 material (either rigid or flexible), the deadfront spacer material and the artwork label which has the embedded icons (or characters of choice). Such display assemblies are generally affixed to the visual side of the product. In these cases, the overall thicknesses of the display assemblies are difficult to minimize and lead to sheet-metal deformation.

SUMMARY

In accordance with an aspect of the invention, an apparatus to allow for a minimization of a thickness of a dead-fronted display assembly is provided and includes a label layer, disposed in a user visible interface of a front bezel, in which an icon is etched, a multi-layer printed circuit board (PCB), abutting a rear surface of the label layer and being configured to form a light source housing that positionally corresponds to that of the icon in which central PCB layers define a central portion of the light source housing as having a first diameter, an intermediate PCB layer, which is adjacent to and forward of the central PCB layers, defines a neck portion of the light source housing as having a second diameter, which is larger than the first diameter, a forward PCB layer, which is adjacent to and forward of the intermediate PCB layer, defines a front portion of the light source housing as having a third diameter, which is larger than the second diameter, and rear PCB layers, which are adjacent to a rear of the central PCB layers, define a rear portion of the light source housing as having a fourth diameter which is larger than the first diameter, a light source assembly, including a substrate, which is fixedly recessed in the rear portion of the light source housing, and a light emitting portion, supported by the substrate, from which light is emitted toward at least the icon, and solder plating, disposed on interior surfaces of the light source housing, to reflect light emitted by the light source away from the preselected icon toward the preselected icon.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

As described below, improved deadfronting or backlighting techniques can be achieved by incorporating indicators into the base FR4 or equivalent printed circuit board (PCB) material. Provisions for recessing the indicator within the thickness dimension of the PCB are implemented in conjunction with providing an illumination egress area within the same PCB.

Figure 1:
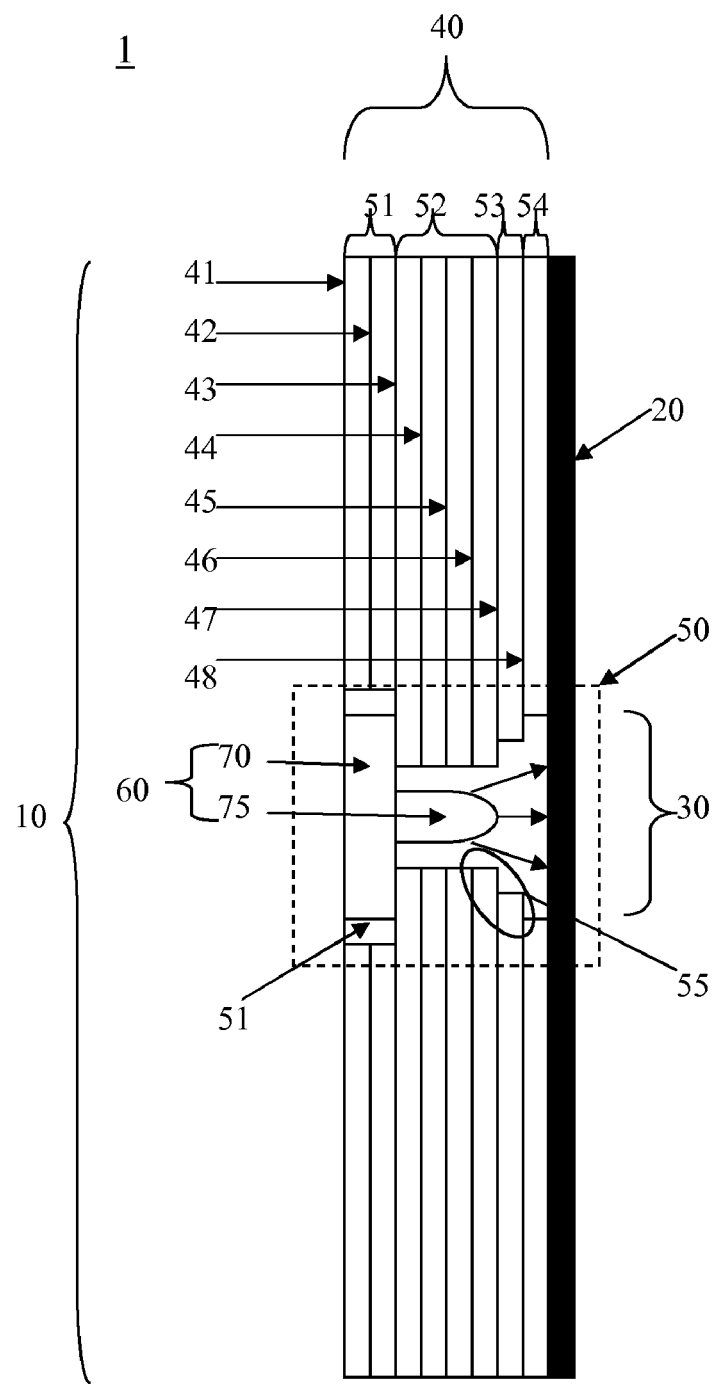
FIG. 1 is a cross-sectional view of a dead-fronted display assembly in accordance with an embodiment of the invention.

With reference to FIG. 1, an apparatus for use in minimizing a thickness of a dead-fronted display assembly is provided and includes a front bezel 1, or some other suitable display assembly, having a user visible interface 10. A label layer 20, such as an artwork label layer, is disposed in the user visible interface 10 with at least one or more preselected icons 30 having been etched therein to have a preselected visible appearance when an illumination source to their rear is activated.

A multi-layer PCB 40, such as an 8-layer PCB, is attached in a stacked arrangement to a rear surface of the artwork label 20. The multi-layer PCB 40 may be made from standard FR4 material and is configured to form a light source housing 50 therein that corresponds in position to a position of the preselected icon 30 along a surface area of the artwork label 20. Within the multi-layer PCB 40, central PCB layers, such as third, fourth, fifth and sixth adjacent PCB layers 43, 44, 45 and 46, are each configured to cooperatively define a central portion 52 of the light source housing 50 as having a first diameter. Similarly, an intermediate PCB layer, such as a seventh PCB layer 47, which is adjacent to and forward of the sixth PCB layer 46, is configured to define a neck portion 53 of the light source housing as having a second diameter, which is larger than the first diameter. A forward PCB layer, such as an eighth PCB layer 48, which is adjacent to and forward of the seventh PCB layer 47, is configured to define a front portion 54 of the light source housing 50 as having a third diameter, which is larger than the second diameter. Lastly, rear PCB layers, such as first and second adjacent PCB layers 41 and 42, which are adjacent to a rear of the third PCB layer 43, are configured to define a rear portion 51 of the light source housing 50 as having a fourth diameter, which is larger than the first diameter and which may be smaller, equal to or larger than the second or third diameters.

Here, it is understood that the use of the multi-layer PCB 40 is merely exemplary and that greater or fewer numbers of individual layers may be employed to similar effect. It is further understood that the configuration of the light source housing 50 within the multi-layer PCB 40 may be changed or modified as needed in accordance with various applications of the present invention. For example, the rear portion 51, the central portion 52, the neck portion 53 and the front portion 54 of the light source housing 50 may include greater or lesser number of individual layers of the multi-layer PCB 40 as described above. That is, in an example, the rear portion 51 may only include the first layer 41 of the multi-layer PCB 40.

A light source assembly 60 is disposed within the light source housing 50. The light source assembly 60 includes a substrate 70, which is fixedly recessed into the rear portion 51 of the light source housing 50, and a light emitting portion 75. The light emitting portion 75 is supported by the substrate 70 and faces the preselected icon 30 via the neck and front portions 53 and 54 of the light source housing 50. In an embodiment of the invention, the substrate 70 may be fixedly recessed with solder 51.

Here, it is noted that the light source may include various light emitting components. For example, the light source may include a light emitting diode (LED) or a conventional light bulb. As a further example, the light source may be electroluminescent.

Solder plating 55 is disposed on interior surfaces of the light source housing 50. As such, when the light emitting portion 75 of the light source assembly 60 is activated, light from the light emitting portion 75 is reflected out of the artwork label 20 via the preselected icon 30.

Figure 2:
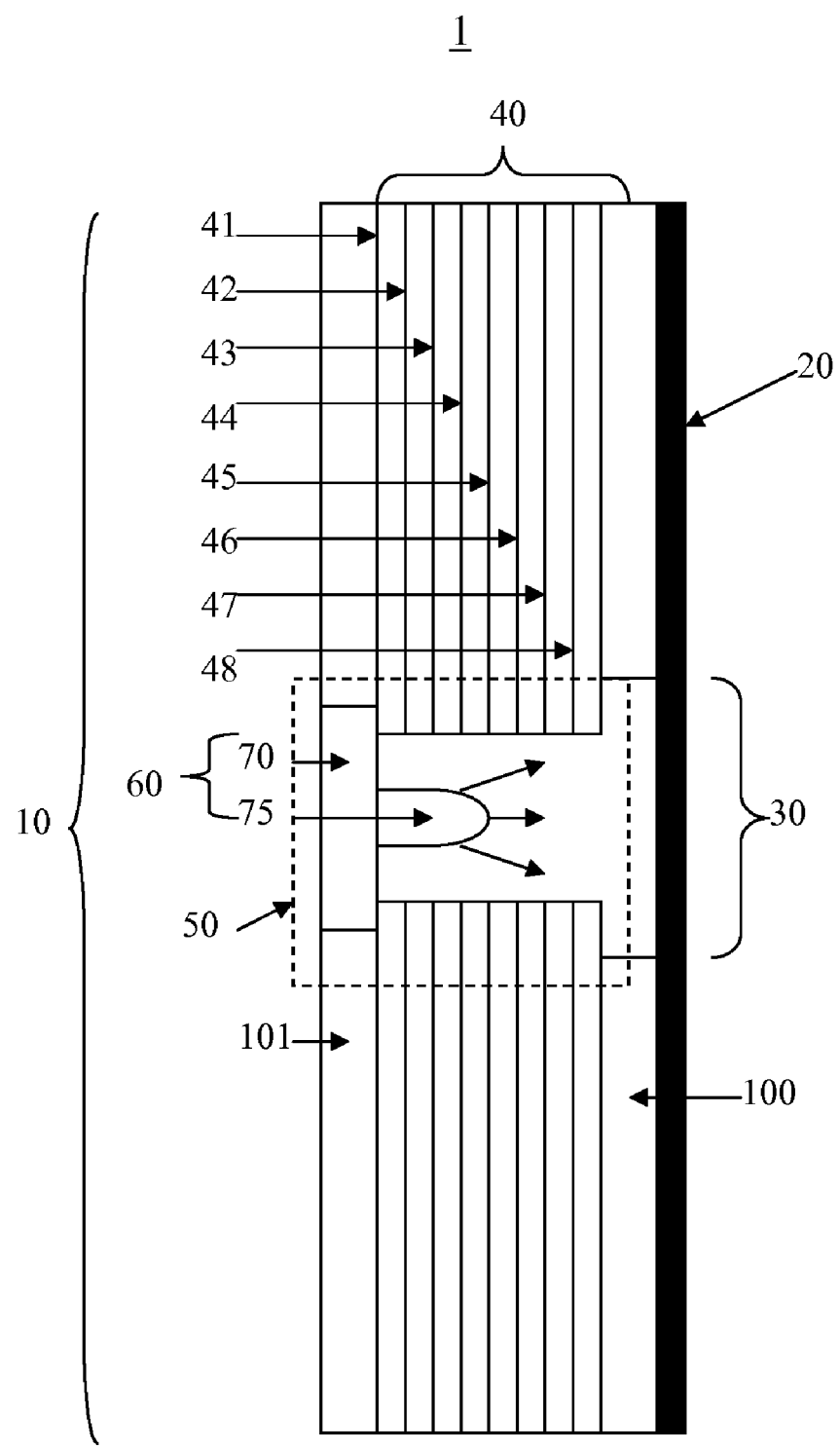
FIG. 2 is a cross-sectional view of a dead-fronted display assembly in accordance with another embodiment of the invention.

With reference to FIG. 2, a second embodiment of the invention is illustrated and includes spacers 100 and 101, which are respectively disposed between the eighth PCB layer 48 and the artwork label 20 and to a rear of the first PCB layer 41. In accordance with this embodiment, the substrate 70 of the light source assembly 60 is fixedly recessed into the spacer 101. Here, each of the above-described eight layers of the PCB 40 define the light source housing 50 as having a uniform diameter while the spacer 100 is configured to define an opening that corresponds in position to that of the light source housing 50 and which has a diameter that is larger than that of the light source housing 50.

Figure 3:
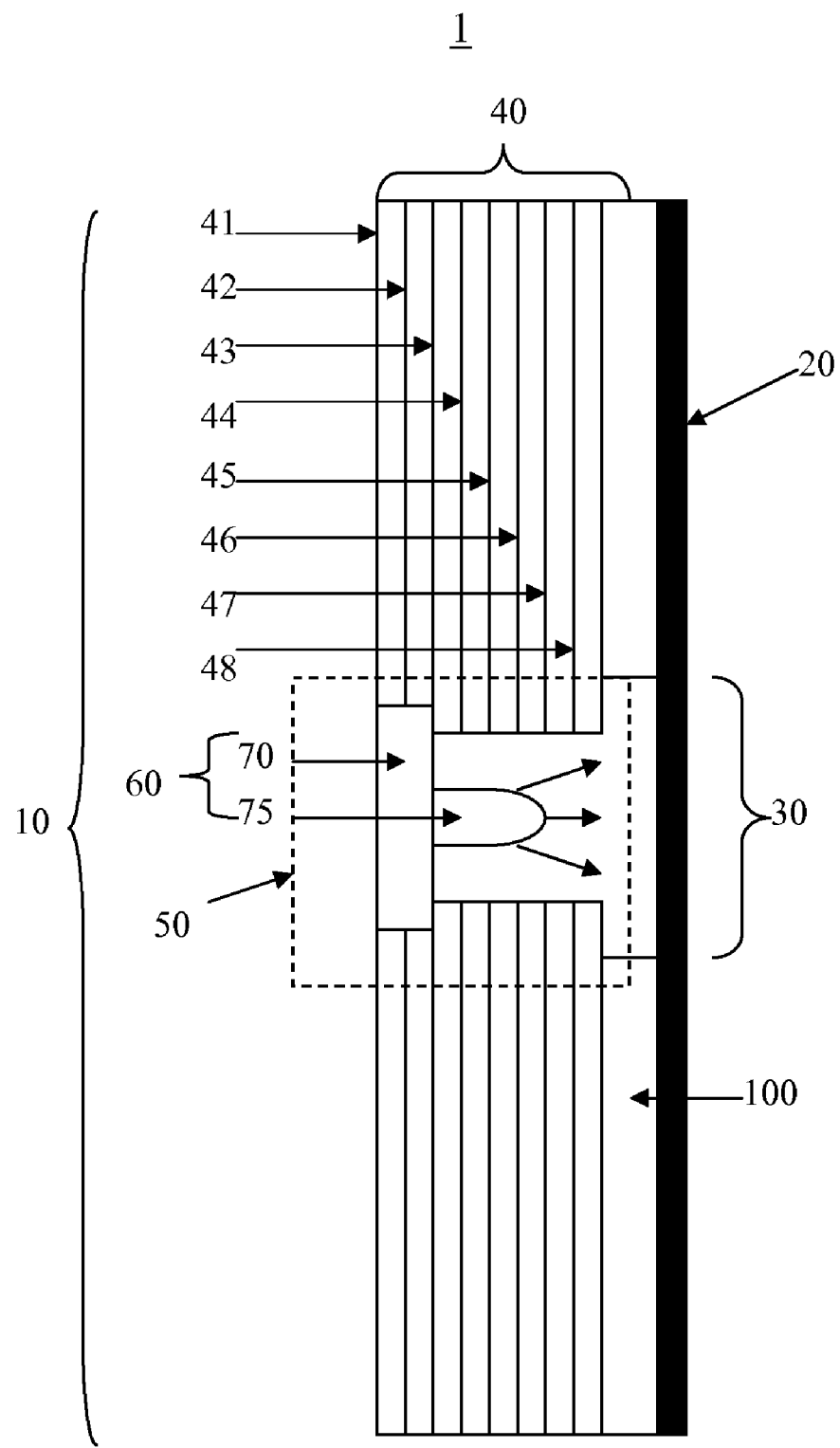
FIG. 3 is a cross-sectional view of a dead-fronted display assembly in accordance with another embodiment of the invention.

With reference now to FIG. 3, a third embodiment of the invention is illustrated and includes only spacer 100. In accordance with this embodiment, the substrate 70 of the light source assembly 60 is fixedly recessed into the first and second PCB layers 41 and 42, as described above in the embodiment of FIG. 1. However, unlike the embodiment of FIG. 1, in this case, the third through eighth PCB layers 43-48 all have similar dimensions. Moreover, as in the embodiment of FIG. 2, the spacer 100 is configured to define an opening that corresponds in position to that of the light source housing 50 and which has a diameter that is larger than that of the light source housing 50.

Of course, it is noted that the various embodiments discussed above may be re-arranged and combined with one another into alternate configurations which are each understood to be within the scope of this patent application. For example, the use of the neck and front portions 53 and 54 of the light source housing 50 can be incorporated into the embodiments of FIGS. 2 and 3. As another example, the solder plating 55 may also be applied to the embodiments of FIGS. 2 and 3.

In accordance with another aspect of the invention, a method of assembling a display assembly is provided and includes etching preselected icons into a label layer, attaching a multi-layer printed circuit board (PCB) in a stacked arrangement to a rear surface of the label layer, the multi-layer PCB being configured to form a light source housing therein that corresponds in position to that of the preselected icon in which third, fourth, fifth and sixth adjacent PCB layers are each configured to define a central portion of the light source housing as having a first diameter, a seventh PCB layer, which is adjacent to and forward of the sixth PCB layer, is configured to define a neck portion of the light source housing as having a second diameter, which is larger than the first diameter, an eighth PCB layer, which is adjacent to and forward of the seventh PCB layer, is configured to define a front portion of the light source housing as having a third diameter, which is larger than the second diameter, and first and second adjacent PCB layers, which are adjacent to a rear of the third PCB layer, are configured to define a rear portion of the light source housing as having a fourth diameter, which is larger than the third diameter, installing a light source assembly within the light source housing, the light source assembly including a substrate, which is fixedly recessed into the rear portion of the light source housing, and a light emitting portion, which is supported by the substrate and which faces the preselected icon via the neck and front portions of the light source housing, and installing solder plating on interior surfaces of the light source housing.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An apparatus to allow for a minimization of a thickness of a dead-fronted display assembly, the apparatus comprising:

a label layer, disposed in a user visible interface of a front bezel, in which an icon is etched;

a multi-layer printed circuit board (PCB), abutting a rear surface of the label layer and being configured to form a light source housing that positionally corresponds to that of the icon in which central PCB layers define a central portion of the light source housing as having a first diameter, an intermediate PCB layer, which is adjacent to and forward of the central PCB layers, defines a neck portion of the light source housing as having a second diameter, which is larger than the first diameter, a forward PCB layer, which is adjacent to and forward of the intermediate PCB layer, defines a front portion of the light source housing as having a third diameter, which is larger than the second diameter, and rear PCB layers, which are adjacent to a rear of the central PCB layers, define a rear portion of the light source housing as having a fourth diameter which is larger than the first diameter;

a light source assembly, including a substrate, which is fixedly recessed in the rear portion of the light source housing, and a light emitting portion, supported by the substrate, from which light is emitted toward at least the icon; and solder plating, disposed on interior surfaces defined by said first through fourth diameters of the light source housing, to reflect light that is emitted by the light source in an initial direction, which is directed away from the preselected icon, in a new direction, which is directed toward the preselected icon.

\* \* \* \* \*